United States Patent
Shelke

(10) Patent No.: US 9,305,777 B2
(45) Date of Patent: Apr. 5, 2016

(54) CATALYST FREE SYNTHESIS OF VERTICALLY ALIGNED CNTS ON SINW ARRAYS

(75) Inventor: Manjusha Vilas Shelke, Maharashtra (IN)

(73) Assignee: Council of Scientific and Industrial Research, New Delhi (IN)

( * ) Notice: Subject to any disclaimer, the term of this patent is extended or adjusted under 35 U.S.C. 154(b) by 146 days.

(21) Appl. No.: 14/008,847

(22) PCT Filed: Mar. 30, 2012

(86) PCT No.: PCT/IB2012/051546
§ 371 (c)(1),
(2), (4) Date: Nov. 26, 2013

(87) PCT Pub. No.: WO2012/131630
PCT Pub. Date: Oct. 4, 2012

(65) Prior Publication Data
US 2014/0183450 A1    Jul. 3, 2014

(30) Foreign Application Priority Data
Mar. 31, 2011   (IN) .............. 0918/DEL/2011

(51) Int. Cl.
| | |
|---|---|
| *C23C 16/00* | (2006.01) |
| *H01L 21/02* | (2006.01) |
| *B82Y 10/00* | (2011.01) |
| *C01B 31/02* | (2006.01) |
| *C30B 25/00* | (2006.01) |
| *C30B 29/06* | (2006.01) |

(Continued)

(52) U.S. Cl.
CPC .......... *H01L 21/02603* (2013.01); *B82Y 10/00* (2013.01); *B82Y 30/00* (2013.01); *B82Y 40/00* (2013.01); *C01B 31/0226* (2013.01); *C30B 25/00* (2013.01); *C30B 29/06* (2013.01); *C30B 29/60* (2013.01); *C30B 29/602* (2013.01); *H01L 21/0262* (2013.01); *H01L 21/02527* (2013.01); *H01L 21/02532* (2013.01); *H01L 29/0676* (2013.01); *C01B 2202/06* (2013.01); *C01B 2202/36* (2013.01); *H01L 51/0048* (2013.01); *H01L 51/0587* (2013.01)

(58) Field of Classification Search
CPC ........ B82Y 30/00; B82Y 10/00; B82Y 40/00; B82Y 35/00; H01L 21/02603; H01L 21/02527; H01L 21/02532
USPC ............................. 427/248.1, 249.1
See application file for complete search history.

(56) References Cited

U.S. PATENT DOCUMENTS

2002/0168525 A1 * 11/2002 Han et al. ............... 428/408

OTHER PUBLICATIONS

Shu et al. Fabrication and field emission properties of multi-walled carbon nanotube/silicon nanowire array, Journal of Physics and Chemistry of Solids 71 (2010) 708-711.*

(Continued)

*Primary Examiner* — Kelly M Gambetta
(74) *Attorney, Agent, or Firm* — Ohlandt Greeley Ruggiero & Perle L.L.P.

(57) ABSTRACT

The present invention discloses novel one dimensional, direct nano-heterojunctions of vertically aligned silicon nanowires (SiNW)-carbon nano tube (CNT) arrays with ultra-low turn-on field useful in single electronic devices. The invention further discloses catalyst free chemical vapor deposition (CVD) route for synthesis of one dimensional, direct nano-heterojunctions of vertically aligned SiNW-CNT arrays.

6 Claims, 7 Drawing Sheets

(51) Int. Cl.
*C30B 29/60* (2006.01)
*H01L 29/06* (2006.01)
*B82Y 30/00* (2011.01)
*B82Y 40/00* (2011.01)
*H01L 51/00* (2006.01)
*H01L 51/05* (2006.01)

(56) References Cited

OTHER PUBLICATIONS

Takagi et al. Carbon Nanotube Growth from Semiconductor Nanoparticles, NanoLetters 7(8), (2007) 2272-2275.*
Hu et.; "Controlled Growth and Electrical Properties of Heterojunctions of Carbon Nanotubes and Silicon Nanowires"; Nature: International Weekly Journal of Science; May 6, 1999; vol. 339; pp. 48-51.
Qinke et al.; "Fabrication and Field Emission Properties of Multi-Walled Carbon Nonotube/Silicon Nanowire Array"; Journal of Physics and Chemistry of Solids; Apr. 1, 2010; vol. 71; pp. 708-711.
Luo et al.; "Controlled Growth of One-Dimensional Metal-Semiconductor and Metal-Carbon Nanotube Heterojuntions"; Advanced Materials, Wiley VCH Verlag DE; Oct. 2, 2002; vol. 14, No. 19; pp. 1-4.
Lu et al.; "Well-Aligned Heterojunctions of Carbon Nanotubes and Silicon Nanowires Synthesizted by Chemical Vapor Deposition"; Journal of Materials Science Letters, Chapman and Hall Ltd. London, GB; vol. 22, No. 15; Aug. 1, 2003; pp. 1107-1109.
Yung et al.; "Mechanism of Selective Growth of Carbon Nanotubes on Si02/Si Patterns"; Nano Letters, ACS, US; vol. 3, No. 4; Jan. 1, 2003; pp. 561-563.
Sinnott et al.; "Model of Carbon Nanotube Growth Through Chemcial Vapor Deposition"; Chemical Physics Letters Elsevier; vol. 315, No. 1-2; Dec. 17, 1999; pp. 25-30.
International Search Report dated Jul. 10, 2012 for PCT application No. PCT/IB2012/051546.
Written Opinion dated Jul. 10, 2012 for PCT application No. PCT/IB2012/051546.

* cited by examiner

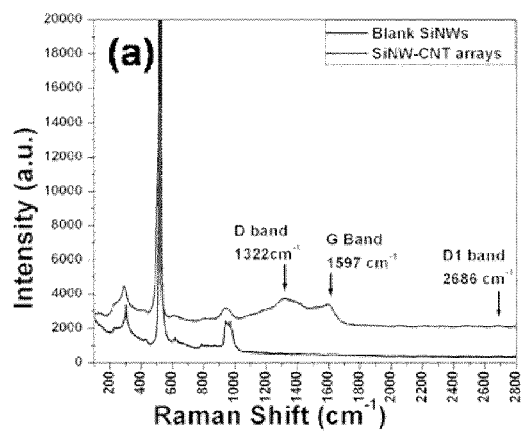
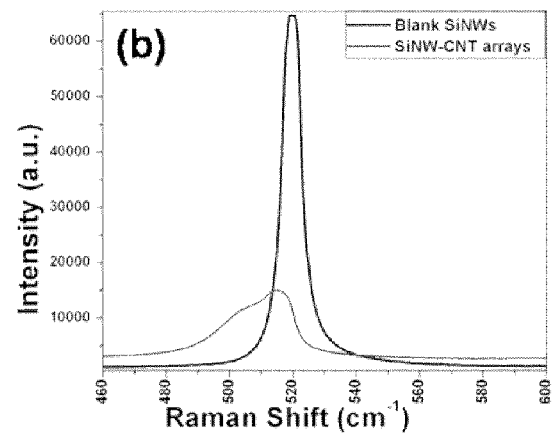
Fig. 3a                                Fig. 3b
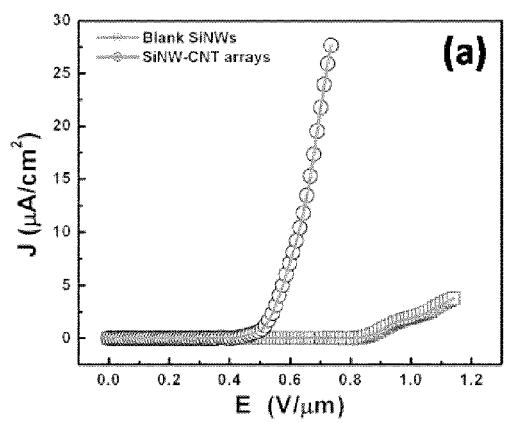
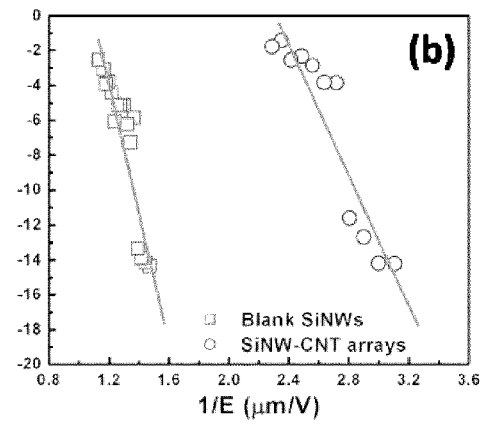
Fig. 4a                                Fig. 4b

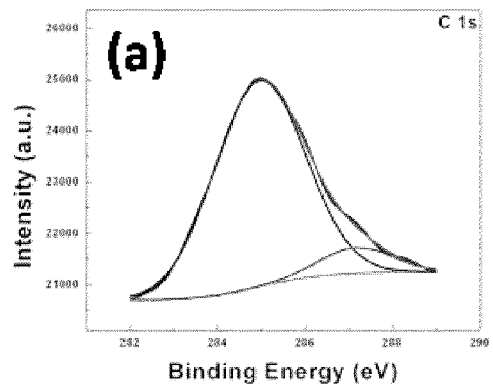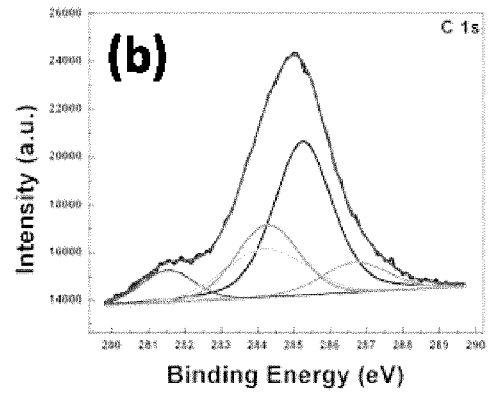
Fig. 7a　　　　　　　　　　Fig. 7b
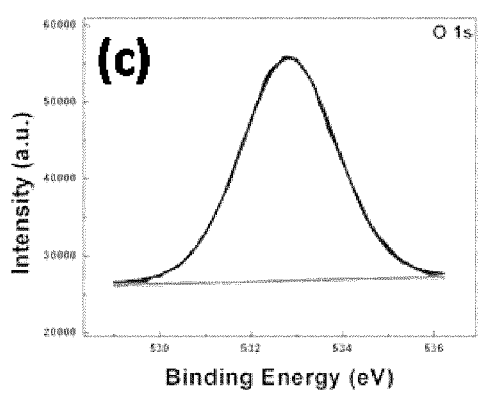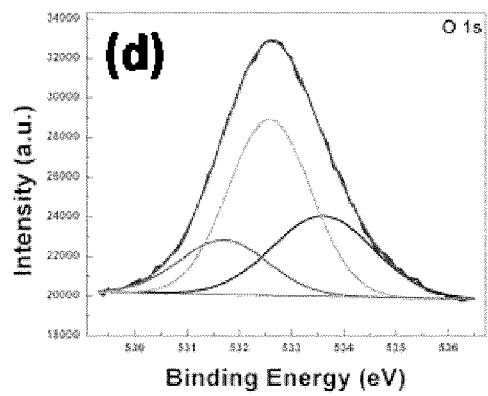
Fig. 7c　　　　　　　　　　Fig. 7d
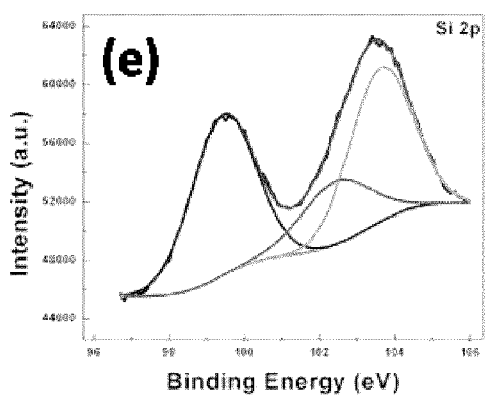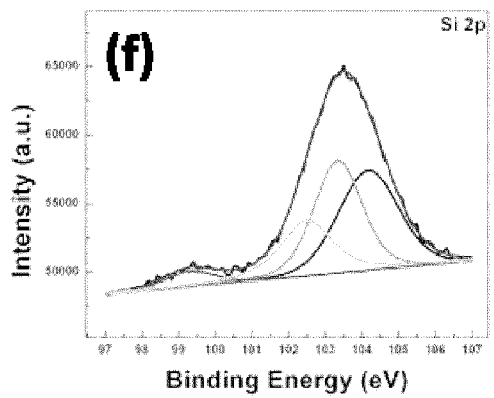
Fig. 7e　　　　　　　　　　Fig. 7f

CATALYST FREE SYNTHESIS OF VERTICALLY ALIGNED CNTS ON SINW ARRAYS

FIELD OF INVENTION

The present invention relates to novel one dimensional, direct nano-heterojunctions of vertically aligned silicon nanowires-carbon nano tube (SiNW-CNT) arrays. More particularly the present invention relates to catalyst free one dimensional, direct nano-heterojunctions of vertically aligned silicon nanowires (SiNW)-carbon nano tube (CNT) arrays. Further, the present invention relates to a catalyst free chemical vapor deposition (CVD) process for synthesis of one dimensional, direct nano-heterojunctions of vertically aligned SiNW-CNT arrays.

BACKGROUND OF THE INVENTION

Carbon nanotubes which are molecular-scale tubes of graphitic carbon have over the past decade attracted much academic and industrial attention due to their unique structure. CNT's (carbon nanotubes) due to intrinsic mechanical and transport properties find various applications viz. as electrode materials, composite materials, nanoelectronics, nanosensors etc. Nanowires that have a thickness or diameter constrained to tens of nanometers or less and an unconstrained length are developed as complementary to CNT's. They are good conductors or semi-conductors and are used in electronics. Considerable effort has been made to explore various heterostructures with the combination of CNTs and NWs. One dimensional (1D) nano-heterostructures have been the focus of research in recent years in the field of nano-electrotechnology, mainly due to their improved properties than the individual ones when considered meticulously separate. Owing to the fascinating properties and applications in a variety of techno-commercially important fields like nanoelectronics, Li-ion batteries, solar cells etc. carbon nanotubes (CNTs) and nanostructured silicon are seen as the most suitable candidates whose properties can be coupled to have a widespread impact. Since both silicon and carbon belong to the same periodic table and moreover their material properties and processing methods are known, for the integration of CNTs with silicon nanotechnology, high aspect ratio silicon nanowires (SiNWs) are preferred as it can offer direct blending of 1D electron transport inherently present in both the systems.

Article titled "Controlled growth and electrical properties of heterojunctions of carbon nanotubes and silicon nanowires" by Jiangtao Hu, Min Ouyang et. al in Nature, 1999, 399, 48 describes Fe-catalyzed fabrication of silicon nanowires with single or multiwalledNTs (nano tubes). In the process NTs were grown from the ends of the SiNWs using ethylene at 600° C.

Article titled "Synthesis of single-walled carbon nanotube networks on silicon nanowires" by H. Yoshida, T. Uchiyama, et. al in Solid State Comm., 2007, 141,632 relates to synthesis of single-walled carbon nanotubes (SWNTs) on silicon nanowires (SiNWs) by ethanol chemical vapor deposition (CVD) using Co catalysts nanoparticles.

Article titled "Fabrication of carbon nanotube/silicon nanowire array heterojunctions and their silicon nanowire length dependent photoresponses" by Yang Cao, Jun-Hui He et. al Chemical Physics Letters Volume 501, Issues 4-6, 7 January 2011, Pages 461-465 relates to fabricated heterojunction structures, which consists of a double-walled carbon nanotube (DWCNT) thin film coated either on an n-type silicon wafer or an n-type silicon nanowires (SiNW) array with varied lengths.

Article titled "Field emission properties of carbon nanotubes grown on silicon nanowire arrays" by Yuming Liu and Shoushan Fan in Solid State Communications, Volume 133, Issue 2, January 2005, Pages 131-134 discloses synthesis of carbon nanotubes on the silicon nanowire arrays, which are fabricated on silicon substrate, by chemical vapor depositing $SiCl_4$ and $H_2$ gases in the presence of Au catalysts. The tangled carbon nanotubes are grown directly from the surface of Si nanowires.

An article titled "Chemical Vapor Deposition of Individual Single-Walled Carbon Nanotubes Using Nickel Sulfate as Catalyst Precursor" by L. W. Liu, J. H. Fang, et. al in J. Phys. Chem. B 2004, 108, 18460-18462 discloses synthesis of individual single-walled carbon nanotubes (SWNTs) directly on a $Si/SiO_2$ substrate by chemical vapor deposition using methane as the feedstock and nickel sulfate as the catalyst precursor.

Article titled "On the Growth and Microstructure of Carbon Nanotubes Grown by Thermal Chemical Vapor Deposition" by Sangeeta Handuja, P. Srivastava in Nanoscale Res Lett. 2010 July; 5(7): 1211-1216. Published online 2010 May 15. describes deposition of Carbon nanotubes (CNTs) on various substrates, namely untreated silicon and quartz, Fe-deposited silicon and quartz, HF-treated silicon, silicon nitride-deposited silicon, copper foil, and stainless steel mesh using thermal chemical vapor deposition technique.

The said prior arts have the following disadvantages: (i) In nano heterostructures of SiNW-CNT having multiple contacts, continuous electron transport from one end of nanowire to the other end of nanotube through heterojunction is lost and the electron path is shared by more than one nanotube, nanowire or both. (ii) In nano hetero structures of SiNW-CNT comprising of a single SiNW and a single CNT, they however have used Fe-based catalyst for the growth of nanotubes. In such cases it is observed that there will not be any direct junction between SiNWs and CNT and the electron has to cross two barriers i.e. one between SiNWs and Fe and second between Fe and CNT before reaching the other end.

Hence, there is need of a process where a direct contact between SiNW and CNT with the heterojunction area in nanometer scale is advantageous for the development of high throughput single electronic devices with enhanced electron field emission characteristics.

OBJECTS OF THE INVENTION

The main object of the present invention is to provide a novel, one dimensional, nano-heterojunction of vertically aligned silicon nanowire-carbon nanotubes (SiNW-CNT) arrays.

Another object of the invention is to provide a catalyst free one dimensional, nano-heterojunction of vertically aligned silicon nanowire-carbon nanotube (SiNW-CNT) arrays.

Yet another object of the invention is to provide a catalyst free chemical vapor deposition (CVD) process for preparation of one dimensional, direct nano-heterojunctions of vertically aligned SiNW-CNT arrays.

Yet another object of the invention is to provide a catalyst free one dimensional, nano-heterojunction arrays with ultra-low turn-on field useful in single electronic devices comprising vertically aligned silicon nanowires and vertically aligned carbon nanotubes, wherein the vertically aligned carbon nanotubes are in direct contact with each vertically aligned silicon nanowires.

Yet another object of the invention is to provide a catalyst free one dimensional, nano-heterojunction array with ultra low turn-on field, showing excellent electron field emission (EME) characteristics.

SUMMARY OF THE INVENTION

Accordingly, the present invention provides one dimensional nano-heterojunction arrays of silicon nanowires-carbon nano tube (SiNW-CNT) obtained by a catalyst free chemical vapor deposition (CVD) process comprising of reacting sublimed aromatic hydrocarbons as carbon precursor with vertically aligned silicon nanowires (SiNWs) in order to directly grow carbon nanotube (CNT) at the active tip of each vertically aligned silicon nano wire.

In another embodiment of the present invention the catalyst free process wherein the direct growth of carbon nanotube at the active tip of each vertically aligned SiNWs comprises the steps; (a) placing the aromatic precursor and SiWN in the in the preheater zone and main reaction zone of CVD respectively; (b) pyrolizing aromatic precursors at a temperature in the range of 150° C. to 400° C. in a preheater zone to produce sublimed carbon; (c) carrying the sublimed carbon as obtained in step (b) to the main reaction zone of CVD by means of carrier gas; and (d) reacting incoming sublimed carbon with SiNW tips heated in the range of 900° C. to 1000° C. in the main reaction zone to produce vertical alignment of CNTs on SiNWs arrays.

BRIEF DESCRIPTION OF DRAWINGS

FIG. 1(*b*) represents tilt angle SEM image at 45° of blank SiNWs.

FIG. 1(*c*) represents large area image of top surface of SiNW-CNT.

FIG. 1(*d*) represents tilt angle SEM image at 45° of SiNW-CNT.

FIG. 2(*b*) HRTEM image of SiNW-CNT heterojunction.

FIG. 3(*a*) represents Raman Spectra for comparison of blank SiNWs and SiNW-CNT arrays.

FIG. 3(*b*) represents Raman Spectra for enlarged portion of characteristic peak of SiNW at 520.7 $cm^{-1}$.

FIG. 4(*a*) represents Field Emission (J-E); current density (J) as a function of applied electric field (E) of blank SiNWs and SiNW-CNT arrays.

FIG. 4(*b*) represents Fowler-Nordheim (F-N) plots of blank SiNWs and SiNW-CNT arrays.

FIG. 7 represents the high resolution XPS spectra of (a) C 1s, (c) O 1s and (e) Si 2p for blank SiNWs and (b) C 1s, (d) O 1s and (f) Si 2p for SiNW-CNT arrays.

DETAILED DESCRIPTION OF THE INVENTION

Figure 1A:
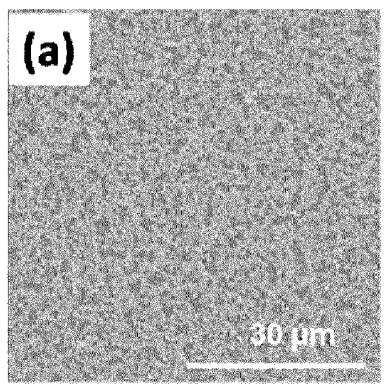
FIG. 1(*a*) represents large area image of top surface of blank SiNWs.

While the invention is susceptible to various modifications and alternative forms, specific aspect thereof has been shown by way of example and graphs and will be described in detail below. It should be understood, however that it is not intended to limit the invention to the particular forms disclosed, but on the contrary, the invention is to cover all modifications, equivalents, and alternative falling within the spirit and the scope of the invention as defined by the appended claims.

The Applicants would like to mention that the examples are mentioned to show only those specific details that are pertinent to understanding the aspects of the present invention so as not to obscure the disclosure with details that will be readily apparent to those of ordinary skill in the art having benefit of the description herein.

The terms "comprises", "comprising", or any other variations thereof, are intended to cover a non-exclusive inclusion, such that a process, catalyst composition that comprises a list of components does not include only those components but may include other components not expressly listed or inherent to such process. In other words, one or more elements in a system or process proceeded by "comprises . . . a" does not, without more constraints, preclude the existence of other elements or additional elements in the system or process.

In the following detailed description of the aspects of the invention, reference is made to the accompanying drawings and graphs that form part hereof and in which are shown by way of illustration specific aspects in which the invention may be practiced. The aspects are described in sufficient details to enable those skilled in the art to practice the invention, and it is to be understood that other aspects may be utilized and that charges may be made without departing from the scope of the present invention. The following description is, therefore, not to be taken in a limiting sense, and the scope of the present invention is defined only by the appended claims.

In accordance with the above aspects, the invention will now be described in detail in connection with certain preferred and optional embodiments, so that various aspects thereof may be more fully understood and appreciated.

One dimensional (1D) nano-heterostructures is the focus of the instant invention mainly due to their improved properties over the individual ones. To extract the actual benefits of nano-heterojunction, direct, single contact between a nanowire and a nanotube is highly desirable. More specifically, the invention is directed to provide nano-heterojunctions that allows for a continuous electron transport from one end of the nanowire to the other end of nanotube thus showing excellent EFE (electron field emission) characteristics.

The present invention relates to one dimensional, nano-heterojunction between vertically aligned silicon nanowires (SiNWs) and carbon nanotube (CNT) arrays where SiNWs are used as a platform for the growth of vertically aligned CNTs. The vertically aligned components comprising of SiNW and CNT are in direct contact In an embodiment, the present invention discloses a catalyst free, one dimensional, nano-heterojunction arrays with ultra-low turn-on field useful in single electronic devices comprising vertically aligned silicon nanowires and vertically aligned carbon nanotubes, wherein the vertically aligned carbon nanotubes are in direct contact with each vertically aligned silicon nanowires.

In another embodiment, the present invention provides catalyst free chemical vapor deposition (CVD) process to obtain one dimensional, direct, nano-heterojunction arrays of SiNW-CNT comprising reacting sublimed aromatic hydrocarbons as carbon precursor with vertically aligned silicon nanowire (SiNW) to nucleate carbon nanotube (CNT) at the active tip of each vertically aligned silicon nano wire.

In another embodiment, the present invention provides a catalyst free process for the synthesis of vertically aligned SiNWs and CNT one dimensional nano-heterojunction arrays by an in-house fabricated chemical vapor deposition (CVD), comprise the steps of; (a) synthesis of vertically aligned silicon nanowires on Si substrates by electroless metal deposition and chemical etching; (b) pyrolizing aromatic precursors at a temperature in the range of 300° C. to 400° C., more preferably in the range of 300° C. to 350° C. in a preheater zone followed by carrying the sublimed precursor to the main reaction zone of CVD along with the flow of the carrier gas; and (c) Reacting incoming sublimed precursor with SiNW tips heated to the range 900° C. to 1000° C.; more preferably in the range of 900° C. to 960° C. in the main reaction zone for 50 to 70 minutes.

In another embodiment of the present invention the direct nano-heterojunction arrays of vertically aligned SiNW-CNT are formed.

In another embodiment of the present invention the aromatic precursor is easily sublimable carbon precursor selected from naphthalene or anthracene or combination thereof.

In another embodiment of the present invention vertically aligned carbon nanotubes (CNT's) comprises multi walled CNT(MWNT).

In another embodiment of the present invention the diameter of vertically aligned CNTs is in the range of 50-100 nm.

In another embodiment of the present invention a catalyst free one dimensional, nano-heterojunction arrays with ultra-low turn-on field useful in single electronic devices comprising vertically aligned silicon nanowires and vertically aligned carbon nanotubes, wherein the vertically aligned carbon nanotubes are in direct contact with each vertically aligned silicon nanowires.

In another embodiment of the present invention the diameter of vertically aligned carbon nanotubes (CNTs) is in the range of 50-100 nm.

In another embodiment of the present invention vertically aligned carbon nanotubes (CNT's) comprises multi walled CNT (MWNT).

The aromatic precursors are selected from naphthalene, anthracene, preferably naphthalene. The carrier gas is selected from inert gas such as argon According to the process, the aromatic precursor, naphthalene or anthracene is kept in the preheater zone at a temperature in the range of 300° C. to 400° C., more preferably in the range of 300° C. to 350° C. and SiNWs is kept in the main reaction zone at a temperature in the range of 900° C. to 1000° C.; more preferably in the range of 900° C. to 960° C. Naphthalene or anthracene or combination thereof is used as the precursor for carbon and is kept in the preheater zone of the dual furnace, to ensure complete sublimation of precursor. The sublimed precursors are then passed into the main reaction zone by means of argon as a carrier gas at a flow rate of 400 sccm to 600 sccm, more preferably in the 450 sccm to 550 sccm where SiNW arrays are heated. The temperature of the reaction zone is programmed in such a way that it attained 950° C. when precursor zone is at 300° C. The reaction is continued for 50 min to 70 min; more preferably in the range of 55 to 65 min to ensure the complete growth of CNTs on SiNW arrays. The growth of CNTs is completed in about 60 min; it follows root growth mechanism resulting in vertical alignment of CNTs on SiNW arrays.

The vertically aligned SiNWs are synthesized by electroless metal deposition (EMD) and chemical etching on Si wafer. Accordingly, phosphorous doped, n-type Si wafer is cleaned initially with the polar solvent selected from acetone, lower alcohols etc and deionized water followed by ultrasonication. The native oxide layer on the silicon wafer is further removed by treatment with boiling piranha solution (98% $H_2SO_4$ and 30% $H_2O_2$ in 3:1 ratio) at about 80° C., further washed with deionized water and dried with Ar flow. The clean Si wafer is kept into a polytetrafluoroethylene (PTFE) containing etching solution of 4.6 M HF and 0.04M $AgNO_3$ (1:1 in volume) in a water bath and heated up to 55° C. for 10 min. After the reaction, the sample is slightly washed with deionized water and kept into the mixture of $HNO_3$:HCl:$H_2O$ (1:1:1 in volume) overnight in order to remove Ag. The SiNW arrays so formed are further dipped into 5% HF solution for 1 min, rinsed with water immediately and dried in an Ar flow. The as prepared vertically aligned (va) -SiNW's are used to grow vertically aligned CNTs.

Figure 9:
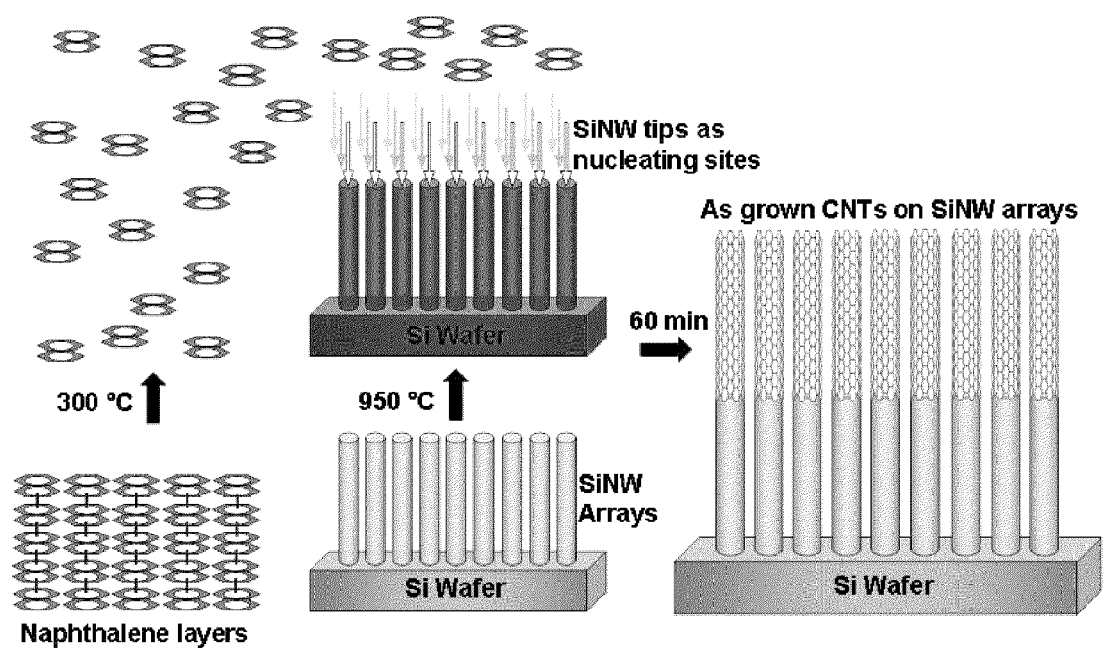
FIG. 9 is a schematic representation for synthesis of vertically aligned CNTs on SiNW arrays.

The nano-heterojunction synthesis is represented in FIG. 9.

The CNTs are grown on the tips of Si instead of $SiO_2$ from SiNWs as observed from TGA and XPS analysis.

The vertical length of SiNW arrays is 4-5 µm and the nanowires occur in bundles where the roughness of the bundles of nanowires is up to 500 nm which acts as a platform for the growth of CNTs.

The CNTs are vertically aligned with the diameter of these nanotubes in the range of 50-100 nm. The carbon nanotubes are observed to be vertically aligned. The typical diameters of NTs are in the range of 50-100 nm which is exactly matching to that of NWs which indirectly gives evidence that a single NT is grown on the top of a single NW. The SiNW tips act as nucleating sites for the growth of CNTs and creates nano-heterojunctions. Moreover, as the diameter of NWs is large i.e. >50 nm, there is no possibility of the formation of single walled or double walled NTs and multiwalled CNTs are formed.

Thus in an embodiment, the vertically aligned CNT's of the instant invention comprises multi walled CNT (MWNT). The carbon content in SiNW-CNT arrays by EDX analysis is observed to be ~43%. The field-enhancement factor is related to the crystal structure, emitter geometry (such as aspect ratio), and the spatial distribution of emitting centers. Accordingly, in an embodiment, the SiNW-CNT arrays of the present invention show excellent EFE (electron field emission) properties with a high field enhancement factor (β) of 6010 than blank SiNWw i.e 2267 as analysed by Fowler-Nordheim (F-N) theory. A comparative chart of the field emission performance of vertically aligned SiNW-CNT nano-heterostructures of the present invention with the reported nano-heterostructures is given below in Table 1;

| Emitter Nanostructures | Synthesis Method | Current Density at Turn on Field | Field Enhancement Factor (β) | References |
|---|---|---|---|---|
| Blank SiNWs | Metal Induced Chemical Etching | 0.006 µA cm$^{-2}$ at 0.91 V/µm | 2267 | Present Study |

-continued

| Emitter Nanostructures | Synthesis Method | Current Density at Turn on Field | Field Enhancement Factor ($\beta$) | References |
|---|---|---|---|---|
| SiNW CNT arrays | Chemical Vapor Deposition | 21.00 µA cm$^{-2}$ at 0.51 V/µm | 6010 | Present Study |
| SiNWs | Metal Induced Chemical Etching | 4.0 µA cm$^{-2}$ at 8.6 V/µm | 440 | Y. F. Tzeng, H. C. Wu, P. S. Sheng, N. H. Tai, H. T. Chiu, C. Y. Lee, I. N. Lin, J. Appl. Mat. And Inter., 2010, 2(2), 331 |
| SiMRs | Metal Induced Chemical Etching | 8.3 µA cm$^{-2}$ at 4.0 V/µm | 1147 | Y. F. Tzeng, H. C. Wu, P. S. Sheng, N. H. Tai, H. T. Chiu, C. Y. Lee, I. N. Lin, J. Appl. Mat. And Inter., 2010, 2(2), 331 |
| sSiNWs | Metal Induced Chemical Etching | a. µA cm$^-$ at 2.0 V/µm | 2533 | Y. F. Tzeng, H. C. Wu, P. S. Sheng, N. H. Tai, H. T. Chiu, C. Y. Lee, I. N. Lin, J. Appl. Mat. And Inter., 2010, 2(2), 331 |
| SiNWs-CNTs | Chemical Vapor Deposition | 4.3 V/µm | 823 | H. C. Wu, T. Y. Tsai, F. H. Chu, N. H. Tai, H. N. Lin, H. T. Chiu, C. Y. Lee, J. Phys. Chem. C, 2010, 114, 130$^a$. |
| Si-CNTs | Chemical Vapor Deposition | 6.7 V/µm | 511 | H. C. Wu, T. Y. Tsai, F. H. Chu, N. H. Tai, H. N. Lin, H. T. Chiu, C. Y. Lee, J. Phys. Chem. C, 2010, 114, 130. |
| r-SiRs-CNTs | Chemical Vapor Deposition | 2.3 V/µm | 1384 | H. C. Wu, T. Y. Tsai, F. H. Chu, N. H. Tai, H. N. Lin, H. T. Chiu, C. Y. Lee, J. Phys. Chem. C, 2010, 114, 130. |
| Si-CNTs | Chemical Vapor Deposition | 2.7 V/µm | — | Fan, M. G. Chapline, N. R. Franklin, T. W. Tombler, A. M. Cassell, H, Dai, Science, 1999, 283, 512 |

$^a$The CNTs are randomly oriented and curved on SiNWs.

The SiNW-CNT arrays of the present invention show outstanding behavior of an ultra-low turn on field of 0.51 V µm-1 with high emission current density of 21 µA cm$^{-2}$ than vertically aligned SiNW arrays with turn on field of 0.91 V µm-1 at emission current density of 0.006 µA cm$^2$. Also, an increase in field enhancement factor ($\beta$) nearly by three times for SiNW-CNT arrays of the instant invention is observed than blank SiNW arrays. The vertically aligned SiNW-CNT nano-heterojuncton arrays of instant invention offers an added advantage over the prior art multiple junctions in that these direct, single, one dimensional contacts between a nanowire and a nanotube allow for a continuous electron transport from one end of the nanowire to the other end of the nanotube and avoids any loss or sharing of the electron path either by one or more nanotube, nanowire or both. The vertically aligned SiNW-CNT arrays of the instant invention with ultra-low turn on field thus opens the door of nano-electronics in many areas of electron emitter device fabrication and applications like flat panel displays.

In an aspect, the SiNW-CNT arrays of the present invention exhibit ultra low turn-on field thus showing excellent EFE (electron field emission) characteristics with high field enhanced factor ($\beta$).

Industrial Applicability

The vertically aligned SiNW-CNT arrays of the present invention can be used in

Field Emitters for enhanced electron emission at the low turn on potentials.

The quality and performance of flat panel displays can be increased with these nano-heterostructures.

The electron transport in single electronic devices like single electron transistors, rectifirers can be increased due to direct contact.

The present invention is illustrated herein below with examples, which are illustrative only and should not be construed to limit the scope of the present invention in any manner.

EXPERIMENTAL

Example 1

Synthesis of SiNWs (Silicon Nano Wires)

A 1×1 $cm^2$ piece of phosphorus doped, n-type Si (100) wafer (0.001-0.002 Ω·cm, Wafernet Inc.) was cleaned sequentially with acetone isopropanol and de-ionized (D.I) Water, (18.2 MΩ·cm) by ultrasonication for 5 min each. The native oxide layer on Si wafer was removed by treatment with boiling piranha solution (80° C.) i.e. 98% $H_2SO_4$:30% $H_2O_2$ (3:1 in volume for 20 min and further washed with D.I water and dried with Ar flow.

The cleaned Si wafer was kept into a Polytetrafluoroethylene (PTFE) vessel containing etching solution of 4.6 M HF, and 0.04 M $AgNO_3$ (1:1 in volume) in a water bath and heated up to 55° C. for 10 min. After the reaction, the sample was slightly washed with D.I. water and further kept into the mixture of $HNO_3$:HCl:$H_2O$ (1:1:1 in volume, overnight in order to remove Ag. As prepared SiNW arrays were dipped into 5% HF solution for 1 min. After taking out it was rinsed with water immediately, dried in an Ar flow and used for synthesis of CNTs.

Example 2

Preparation of Nano Heterojunctions

The nano-heterojunction of SiNW-CNT arrays were synthesized by an in-house fabricated CVD set-up, capable of attaining 1200° C. (with a dual zone). The end of the main (reaction) zone was connected to the exhaust system through a cooling condenser, where the unreacted hot gases are trapped. In the beginning, quartz tube (inner diameter 34 mm and length 108 mm) was cleaned with ethanol several times, followed by air blowing. This was followed by passing, a stream of argon through the quartz tube at 100 standard cubic centimetres per minute (sccm) to expel all the impurities. This quartz tube was kept horizontally inside the dual zone electric furnace. Naphthalene, was used as the precursor for carbon source and was kept in the preheater zone of the dual furnace, maintaining the temperature at 300° C. to ensure complete sublimation of naphthalene. The sublimed precursors were then passed into the main (reaction) zone by means of argon (Ar) as a carrier gas at 500 sccm where SiNW arrays (as obtained in example 1) were heated at 950° C. The temperature of the reaction zone was programmed to attain 950° C. when precursor zone reached at 300° C. The heating rate of furnace was maintained at 20° C./min, the Ar flow rate was maintained at 500 sccm to minimize oxygen in SiNWs. the reaction was carried out for 60 min to grow the CNTs on SiNW arrays with the diameter of these nanotubes in the range of 50-100 nm.

Scanning electron microscopy (SEM) images of samples were taken on Quanta 200 3D FEI instrument. Atomic Force Microscope (AFM) (Model: MMAFMLN, Veeco Digital Instruments, Santa Barbara, Calif., USA) images were taken at tapping mode. Raman analysis of samples was performed on a JASCO confocal Raman spectrometer using 532 nm green laser (NRS 1500 W). Thermogravimetric Analysis (TGA) was performed on a SDT Q600 TG-DTA analyser under air atmosphere at a heating rate of 10° C. $min^{-1}$. The samples for TGA were collected in powder form by scratching the SiNWs and SiNW-CNT arrays from silicon wafer.

X-ray Photoelectron Spectroscopic (XPS) measurements were carried out on a VG Micro Tech ESCA 3000 instrument at a pressure of >1×$10^{-9}$ Torr (pass energy of 50 eV, electron take off angle 60° and the overall resolution was ~0.1 eV).

I. SEM Studies

SEM images of SiNW arrays synthesized by EMD and chemical etching are given as FIG. 1(a, b).

FIG. 1(a) gives the large area image of top surface of SiNW arrays.

Figure 1B:
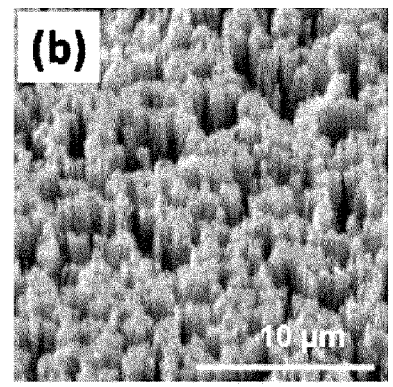

FIG. 1(b) is tilt angle SEM image at 45°.

Figure 1C:
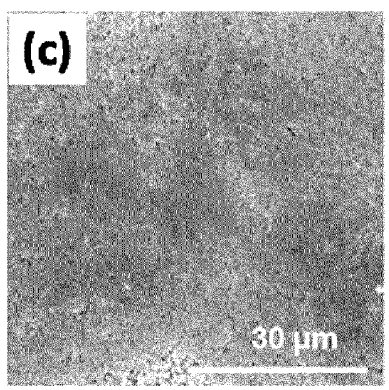

FIG. 1(c) is the large area top surface image of SiNW-CNT.

Figure 1D:
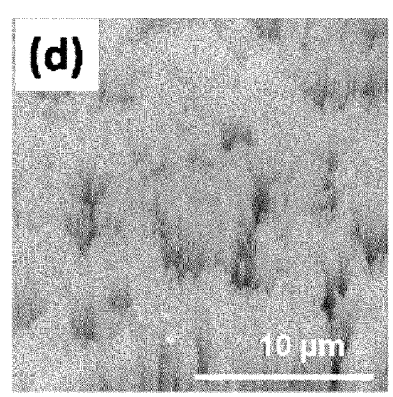

FIG. 1(d) is a 45° tilt angle SEM image of the vertically aligned nano-heterojunction. The roughness of the bundles of nanowires is up to 500 nm which acts as a platform for the growth of CNTs. To see the morphological changes after CNTs growth on SiNW arrays, SEM images were taken at same magnification as blank SiNWs.

The sharp contrast between FIGS. 1(a) and (c) and FIGS. 1(b) and (d) clearly indicates the uniform growth of CNTs where these nanotubes are also vertically aligned. The growth of CNTs occurs from the tip of a single SiNW which further forms bundles on vertically aligned SiNW bundles.

Figure 2A:
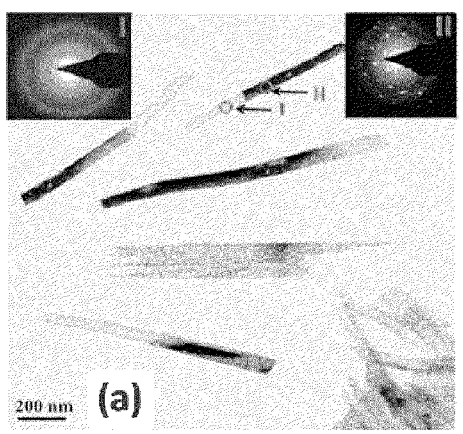
FIG. 2(*a*) represents TEM image of SiNW-CNT heterojunctions (the inset SAED patterns are taken from the marked area s I and II.
Figure 2B:
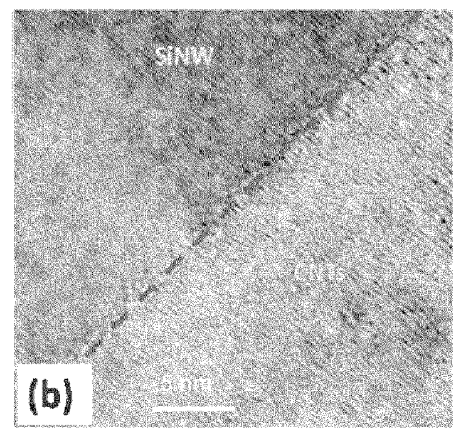

Further from the TEM image of SiNW-CNT heterojunctions given in FIG. 2(a). (SAED i.e selected area electron diffraction patterns are taken from the CNT segment (marked as I) and the SiNW segment (marked as II) of one of the heterojunctions), indicates that the SiNW is single crystalline whereas the CNT is polycrystalline. FIG. 2(b) is the HRTEM image of a heterojunction showing lattice fringes of Si and wavy fringes of the CNT indicating sharp heterojunction formation between single SiNWs and CNTs.

Figure 5:
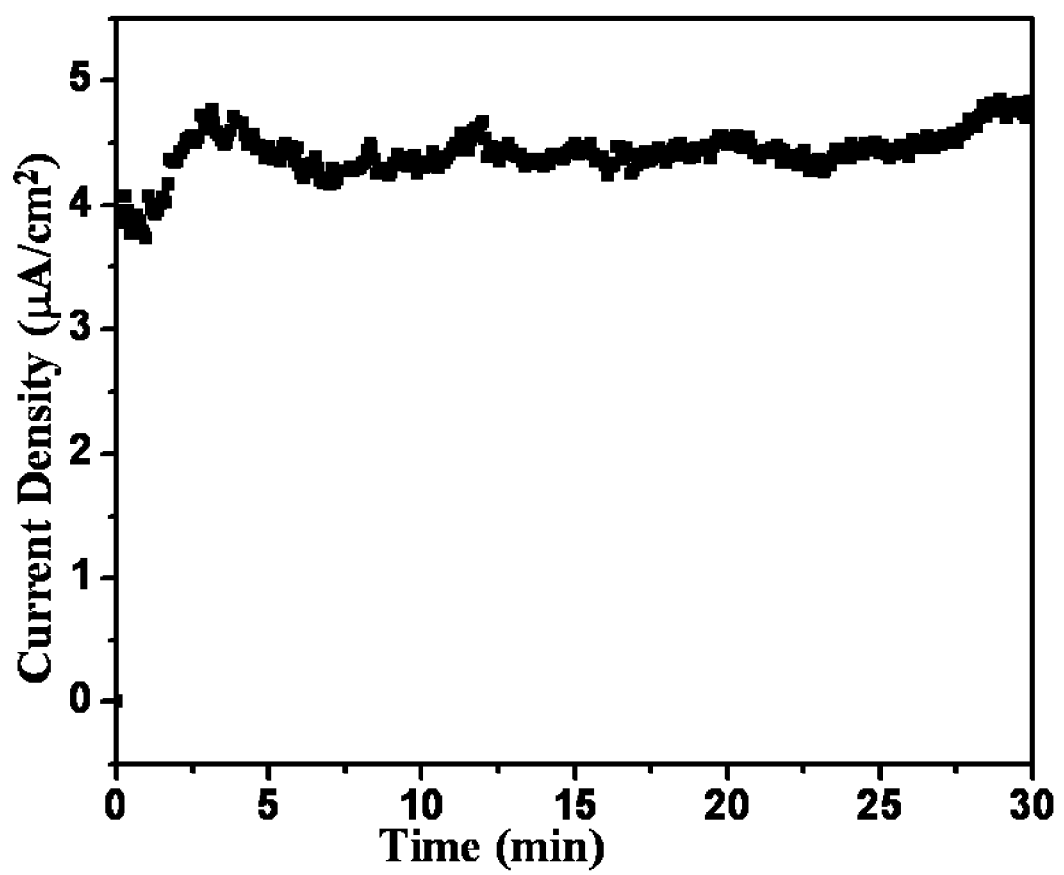
FIG. 5 represents stability measurement of Field Emission Current Density ($\mu Acm^{-2}$) as a function of time.
Figures 6A, 6B:
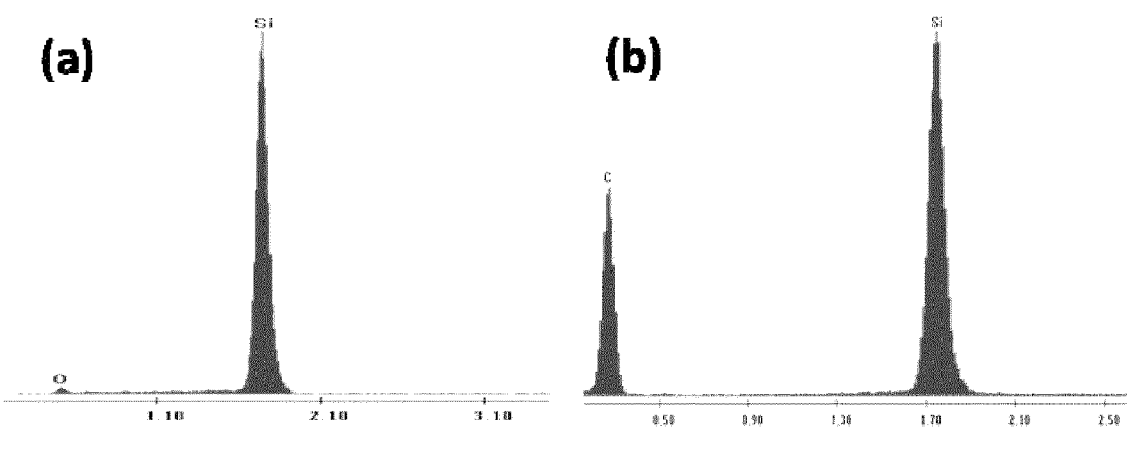
FIG. 6 represents energy dispersive X-ray analysis of (a) blank SiNWs and (b) SiNW-CNT arrays.

It is further evident from the TEM images that the typical diameters of CNTs are in the range of 50-100 nm which is exactly matching to that of SiNWs which indirectly gives evidence that a single CNT is grown on the top of a single SiNW. From TEM imaging it is observed that the CNTs are not covering the surface of SiNWs instead are forming heterojunctions with SiNWs as shown in FIG. 9. The SiNW tips act as nucleating sites for the growth of CNTs and creates nano-heterojunctions. Moreover, as the diameter of SiNWs is large i.e. >50 nm, there is no possibility of the formation of single walled or double walled NTs and multiwalled CNTs are formed by this approach. Growth of CNTs is further confirmed by AFM, EDX analysis and water contact angle measurements (FIGS. 5-7, ESI I). It shows ~43% of carbon content in the spectra after the growth of CNTs.

Raman Spectroscopy is used to confirm the type (SWNTs, DWNTs or MWNTs) as well as the purity of carbon nanotubes.

FIGS. 3 (a) and (b); show the Raman Spectra of blank SiNWs and SiNW-CNT arrays respectively. The blank SiNWs show characteristic Raman peaks at 520.7, 957.2 and 296 $cm^{-1}$ corresponding to the first order transverse optical phonon mode (TO), the second order transverse optical phonon mode (2TO) and the second order transverse acoustic phonon mode (2TA) respectively. After CNT growth the spectrum showed some additional peaks. The peak at 1597 $cm^{-1}$, which is the graphitic peak (G band) is a peculiar characteristic of carbon nanotubes, confirms that CNTs have grown on the surface of SiNWs array. The second newly formed peak at 1322 $cm^{-1}$ (D band) indicates the induction of defective layers on the surfaces of CVD grown CNTs. After the CNT growth there is a shift in the peak position as well as decrease in the intensity of the peak at 520.7 $cm^{-1}$. The 5.44 $cm^{-1}$ shift in the characteristic peak of Si gives an evidence that there is a direct interaction between the NWs and NTs. The abrupt decrease in the intensity of the peak further underlies the above fact.

Thermo gravimetric analysis (TGA) confirm whether the nano-heterojunction is formed on Si or $SiO_2$.

FIG. 4 shows TGA of (a) blank SiNWs and (b) SiNW-CNT arrays from room temperature to 1000° C. in air. Both the samples were collected by scratching SiNWs and SiNW-CNTs from the surface of silicon wafer. It was found that there were distinct differences in the TG profiles of the two samples. FIG. 4 (a) which corresponds to blank SiNWs shows slight initial weight loss upto 350° C. corresponding to $SiO_2$, after that the profile shows continuous weight gain. This weight gain indicates that ~97.8% of the SiNWs is Si and only ~2.2% is in the form of $SiO_2$. Inset of FIG. 4(a) is enlarged portion of it up to 550° C. It confirms that the surface of blank SiNWs is covered with $SiO_2$ and initial weight loss up to 350° C. is due to loss of $SiO_2$ from the surface of SiNWs. After 350° C., the continuous weight gain is due to the oxide formation of exposed SiNWs. TGA profile of SiNW-CNT arrays in FIG. 4.(b) indicates the initial weight loss starting from 500° C. up to 650° C. is corresponding to CNTs on SiNWs. The weight loss is considerably 43%, illustrating that the growth of CNTs on SiNWs is uniform and covering all SiNWs surface as can be seen from SEM images also. The remaining 57% is SiNWs. This confirms that the CNTs are grown on the tips of Si instead of $SiO_2$ from SiNWs, which is further supported by XPS analysis.

II. XPS Studies

High resolution (0.1 eV) XP spectra are recorded to identify the chemical states of blank and heterojunction samples. The core level binding energies were referenced to the C 1s neutral carbon peak at 285.0 eV, to compensate for the effect of surface charging.

Figures 8A, 8B:
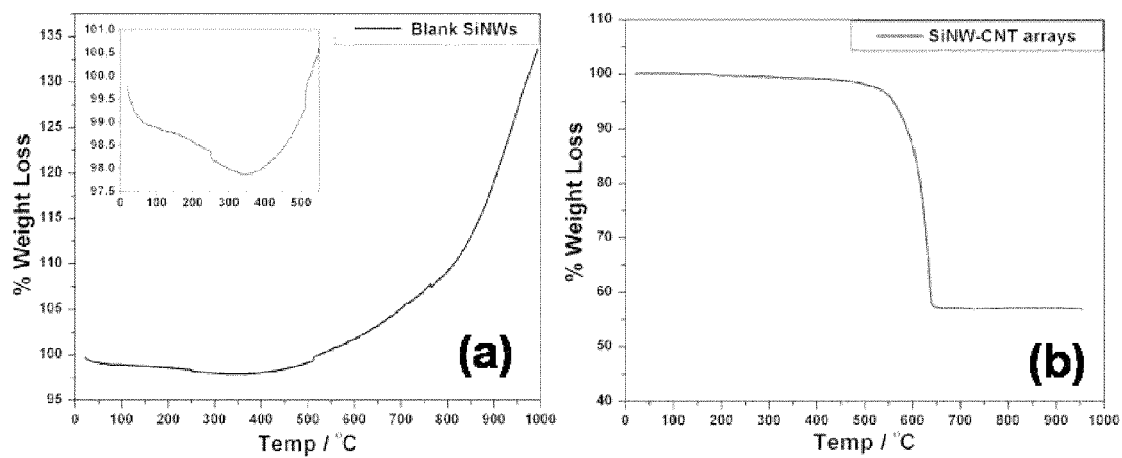
FIG. 8 represents the TGA profile obtained in air from room temperature to 1000° C. for (a) blank SiNWs; inset of Figure (a) shows the enlarged portion showing the initial weight loss followed by the weight gain of SiNWs (b) SiNW-CNT arrays.

It can be seen (FIG. 8) from the close spectral inspection of the C1s region of the samples of (a) blank SiNW and (b) SiNW-CNT arrays showed peaks for C—C at 285.1 eV. A new peak at 284.5 eV in SiNW-CNT sample refers to the formation of C—Si bond; it also inform that carbon is present C in graphitic phase and consequently confirms formation of CNTs on SiNWs. Peaks at higher binding energy can be attributed to other functional groups like —OH or adventitious chamber impurities.

High resolution O 1s peak analysis showed that both (c) SiNW and (d) SiNW-CNT are having peaks at 532.6 eV corresponding to O—Si bond. However, in SiNW-CNT arrays intensity of O—Si peak is decreased and a new peak appearing at 531.5 eV indicates formation of O—C bond. The Si 2p electron orbital spectra are shown for (e) blank SiNW and (d) SiNW-CNT. Peaks at 103.6 eV and 99.6 eV correspond to Si—O and Si—Si bond respectively with decreasing intensity of later in SiNW-CNT arrays. A new peak at 102.5 eV in SiNW-CNT arrays corresponds to Si—C bond.

III. Electron Field Emission Studies

Field electron emission measurements on bare SiNWs and SiNW-CNT arrays are carried out in planar diode configuration under ultra-high vacuum.

A vacuum in the order of $1 \times 10^{-7}$ mbar and below is routinely obtained and maintained in the field emission system with the help of sputter ion pump and titanium sublimation pump. The current-voltage (I-V) characteristics are recorded using a high voltage power supply (0-40 kV, Spellman, USA) and a picoammeter (Keithley 614) at room temperature. Fowler-Nordheim (F-N) plots are obtained from the recorded I-V data. The cathose anode separation is kept at ~1.5 mm for both the samples. All field emission experiments were carried out in under identical conditions and are repeated at least three times and the results are found to be highly reproducible.

Analysis of electron field emission (EFE) characteristics based on Fowler-Nordheim (F-N) theory.

FIG. 4 demonstrate the EFE behaviors; of which FIG. 4(a) is the (J-E) i.e. current density (J) in [$\mu A/cm^2$], as a function of the applied field (E) in [$V/\mu m$] and FIG. 4 (b) is the F-N plot of [$\ln(J/E^2)$] in [$(\mu A/cm^2)/(V/\mu m)^2$] versus (1/E) in [$\mu m/V$] at an anode-cathode separation of 870 $\mu m$. An ultra-low turn on field of 0.51 V $\mu m^{-1}$ has been observed to generate a comparatively high emission current density of 21 $\mu A\ cm^{-2}$ at applied field of 0.7 V $\mu m^{-1}$ for SiNW-CNT arrays. Comparatively, blank SiNW arrays showed turn on field of 0.91 V $\mu m^{-1}$ at emission current density of 0.006 $\mu A\ cm^{-2}$ at the same applied field of 0.7 V $\mu m^{-1}$ under similar experimental conditions. The excellent EFE of SiNW-CNT arrays over blank SiNWs could be due to the proper nano-contact of nano-heterojunctions showing good electron transport from SiNW to CNT and finally emission of electrons from CNTs.

FIG. 4(b) shows that both blank SiNWs and SiNW-CNT heterostructures have an individual linear relationship, indicating that the electron field-emission behavior obeys the F-N theory, and is a potential barrier tunneling, quantum mechanical process.

Stability of the Field-Emitters

FE stability measurements on the SiNWs and SiNW-CNT arrays are performed by keeping an electric field at 0.89 V/$\mu m$ over a period of 30 minutes. As shown in FIG. 5 (S. 1.), there were no current degradations or notable fluctuations during this period. The high reproducibility of the results even at high vacuum of the electron emitters is due to strong Si—Si covalent bonds between single nanowires and substrates for SiNWs and strong Si—C bond formation of nano-contacts in case of SiNW-CNT arrays.

Advantage of Present Invention

There are some reports that discuss the heterojunction formation of CNTs with Si/SiNWs, however in most of the cases there are multiple contacts. In such cases the continuous electron transport will be lost and the electron path will be shared by more than one nanotube, nanowire or both. Herein, for the first time we report a catalyst-free method for the synthesis of a direct nano-heterojunction between CNTs and SiNWs by a simple chemical vapor deposition route for enhanced electron field emission characteristics.

What is claimed is:

1. A catalyst free chemical vapor deposition (CVD) process to obtain one dimensional, direct, nano-heterojunction arrays of silicon nanowire-carbon nanotube (SiNW-CNT) comprising reacting sublimed aromatic hydrocarbons as carbon precursor with vertically aligned SiNW to grow a single vertically aligned CNT at nanoscale nucleation site at the tip of each single vertically aligned SiNW and provide direct contact between each CNT and SiNW.

2. The catalyst free process according to claim 1, wherein the direct growth of each CNT at the nanoscale nucleation site at the tip of each vertically aligned SiNW comprises;
 (a) pyrolizing aromatic precursors at a temperature in the range of 150° C.-350° C. in a preheater zone followed by carrying sublimed carbon to a main reaction zone of CVD along with the flow of the carrier gas; and
 (b) reacting incoming sublimed carbon with SiNW tips in the range of 900° C. to 960° C. in the main reaction zone to achieve complete vertical alignment of CNTs on SiNWs arrays.

3. The catalyst free process according to claim 1, wherein direct nano-heterojunction arrays of vertically aligned SiNW-CNT are formed.

4. The catalyst free process according to claim 1, wherein the aromatic precursor is sublimable carbon precursor selected from naphthalene or anthracene.

5. The catalyst free process according to claim 1, wherein the vertically aligned CNT comprise multi walled CNT(M-WNT).

6. The catalyst free process according to claim 1, wherein the diameter of vertically aligned CNTs is in the range of 50-100 nm.

* * * * *